United States Patent [19]

Marshall

[11] 4,023,166
[45] May 10, 1977

[54] HIGH POWER LOW LOSS NONRESONANT FILTER SYSTEM

[75] Inventor: Richard M. Marshall, Sudbury, Mass.

[73] Assignee: Raytheon Company, Lexington, Mass.

[22] Filed: June 23, 1975

[21] Appl. No.: 589,229

[52] U.S. Cl. .................................. 343/5 R; 331/77
[51] Int. Cl.² ...................... G01S 9/02; H03B 1/04
[58] Field of Search ...................... 343/5 R; 331/77

[56] References Cited

UNITED STATES PATENTS

| | | | |
|---|---|---|---|
| 2,702,371 | 2/1955 | Sunstein | 333/11 |
| 2,866,949 | 12/1958 | Tillotson | 333/9 X |
| 2,951,996 | 9/1960 | Pan | 333/9 |
| 2,991,471 | 7/1961 | Pritchard | 343/5 R X |
| 3,174,149 | 3/1965 | Winn | 343/5 R X |
| 3,384,890 | 5/1968 | List et al. | 343/5 R |
| 3,438,029 | 4/1969 | Fuchser et al. | 343/5 R |

Primary Examiner—Malcolm F. Hubler
Attorney, Agent, or Firm—Joseph D. Pannone; Milton D. Bartlett; Herbert W. Arnold

[57] ABSTRACT

A radar system using a resonant circuit pulsed generator such as a magnetron with a nonresonant filter using directional couplers to split the power output of the generator into two signal channels and to directionally recombine the channels after the channels have passed through different delay times, with the differential delay between the channels being selected to direct the desired frequency components of the generator to a first output port and undesired sidebands or other spurious signals of the generator to a second port.

20 Claims, 6 Drawing Figures

HIGH POWER LOW LOSS NONRESONANT FILTER SYSTEM

BACKGROUND OF THE INVENTION

High power high frequency generators such as magnetrons operating in a pulse mode characteristically produce a wide spectrum of frequencies extending beyond the desired frequency range to be used. Such frequencies, having been previously absorbed by resistive loads, reflected back into the magnetron with deleterious results such as overheating of the cathode or in radar have been radiated into the atmosphere where they interfere with other equipment. Systems for absorbing such undesired frequencies have been very expensive when high power sources are involved and have been difficult to align and/or realign when a high frequency source has shifted slightly in frequency as, for example, when a magnetron burns out and is replaced in an existing equipment. While frequency responsive systems for coupling two or more widely separated frequencies to the same antenna have been used, such coupling systems did not filter frequency components closely adjacent the desired frequency band from the system. Alternative methods of treatment of the problem, such as generating signals at low power, filtering the desired frequency components from the generated signals and then amplifying the resultant filtered signals, are expensive and require complex tuning and/or returning procedures.

In addition, if filtering is done by resonant techniques at high power, voltage nodes in the resonant system require extremely high voltage insulation for the radiated field, and such insulation is bulky, expensive and difficult to align.

SUMMARY OF THE INVENTION

In accordance with this invention, a combined high frequency generator and filter system is provided in which the frequency of the spectrum from the generator is shaped by the filter, with the undesired portions thereof being directionally coupled to an energy absorbing load.

The output filter in this invention is a substantially nonresonant filter through which high power levels of signal waves may be transmitted without producing regions of propagated wave field intensity substantially higher than the average throughout the filter, and thus voltage breakdown levels of the dielectric insulating medium in such regions are reduced and, hence, less bulky and/or expensive structures and/or insulation are required.

More specifically, this invention provides for a source of microwave energy such as a pulse magnetron whose output is directed through a first hybrid coupler to a plurality of signal channels which feed a second hybrid coupler, with one of the channels being delayed by a distance selected in accordance with the desired frequency band to be passed and the output of the second hybrid coupler being used to feed any desired load such as the antenna of a radar system. Preferably, the delay between the two channels is made to be sufficient to produce a change in delay of one half wavelength with a change from the desired center frequency of the magetron output and the frequency at which it is desired that substantially no power be transmitted through the filter. Under these circumstances, at the cutoff frequency of the filter all the power emitted from the magnetron will be transferred to a second output port of the second hybird coupler and absorbed by a resistive load. For example, if it is desired to radiate a pulse of one microsecond duration with a frequency spectrum of approximately 20 megahertz bandwidth produced from a magnetron having a bandwidth larger than 20 megaherts, then a difference in delay of the two channels of the filter equal to an odd number of half wavelengths at the center frequency is required. At ten megahertz away from the center frequency, the channel delay is an even number of half wavelengths causing frequencies at or greater than ten megahertz away from the center frequency to shift from the desired output port to the absorbing load output port thereby effectively cutting off transmission at the undesired frequencies to a load such as a radar antenna fed by the desired output port.

BRIEF DESCRIPTION OF THE DRAWINGS

Other and further objects and advantages of the invention will become apparent as the description thereof progresses, reference being had to the accompanying drawings wherein.

DESCRIPTION OF THE PREFERRED EMBODIMENT

Figure 1:
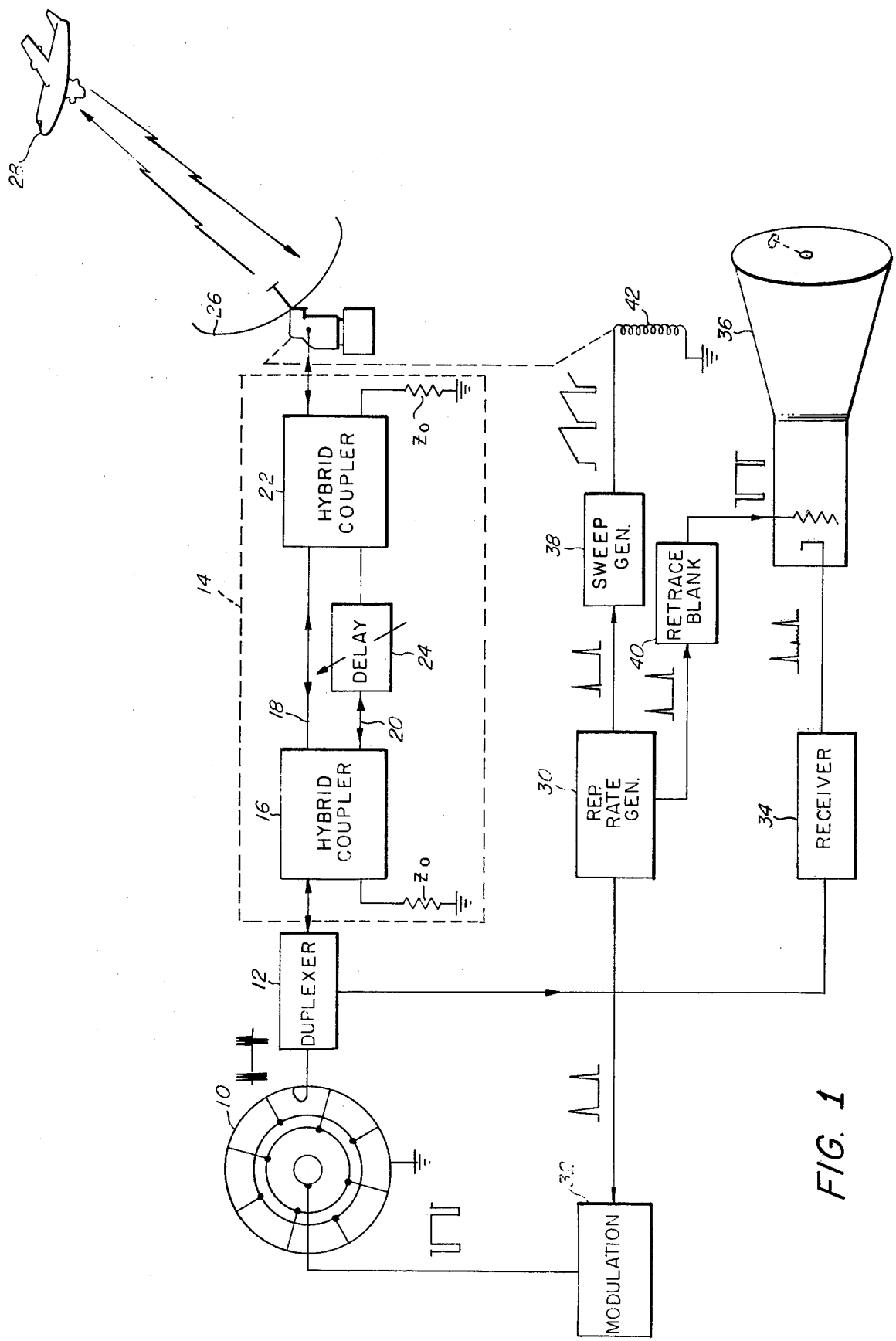
FIG. 1 illustrates a functional flow diagram of a radar system embodying the invention.

Referring now to FIG. 1, there is shown a radar system embodying the invention. A source of oscillations, such as magnetron 10, has its output coupled through a conventional duplexer 12 and antenna 26 through a bandpass filter 14.

Filter 14 comprises a first conventional four-port hybrid coupler 16 which splits the oscillation power of magnetron 10 into two equal halves. Half of the power is fed directly to channel 18, and the other half of the power is coupled via the branch to a second channel 20 with a phase shift which leads the power in channel 18 by $\pi/2$ radians. The fourth port of coupler 16 is terminated in its characteristic impedance $Z_0$ as shown.

Channel 18 is connected to a first input port of a second hybrid coupler 22, and channel 20 is connected to a second input port of coupler 22 through a signal delay structure 24 which is chosen to make channel 20 an odd number of half wavelengths longer than channel 18 at the center frequency of magnetron 10. Delay 24 may be a lump constant network or may be formed by making the physical length of transmission line 20 longer than the physical length of line 18 by the desired number of half wavelengths. As a result, at said center frequency power from oscillations produced by magnetron 10 will be directed to one of the output ports of coupler 22, and this output port is fed via a conventional system including rotary joints and any other desired structure to directive antanna 26 while oscillation frequencies of power from magnetron 10 at which channel 20 is an even number of half wavelengths longer than channel 18 will be coupled to the output of coupler 22 which is shown as terminated in the $Z_0$ resistance.

A repetition rate generator 30 of conventional design supplies pulses of, for example, 1,000 pulses per second to a modulator 32 which pulses the cathode of magnetron 10 with high voltage negative pulses of, for example, a microsecond to produce directive radiation of pulses of microwave energy from antenna 26.

Reflected echoes of such radiated pulses from targets such as plane 28 are received by antenna 26 and fed back through the filter 14 to duplexer 12 where they are switched to receiver 34 in a conventional manner. The output of receiver 34 may be used for any desired purpose, such as display by a conventional cathode ray tube 36. Such a display can be, for example, a P.P.I. display in which a deflection sweep generator 38 fed by repetition rate generator 30 and driving yoke 42 which deflects the beam of the cathode ray tube 36 and which rotates in synchronism with antenna 26, with retrace blanking of the tube being achieved by circuit 40 fed by repetition rate generator 30.

The magnitude of the delay 24 of filter 14 depends on the side band frequency of magnetron 10 at which maximum suppression of radiation from antenna 26 is desired. As an example, if it is desired to radiate from antenna 26 a 1 microsecond pulse of oscillations having a center frequency of 3,000 megahertz with a maximum suppression of frequencies displaced from the center frequency by 10 megahertz, then magnetron 10 would be pulsed by modulator 32 to produce a pulse of energy of approximately one microsecond duration. Such a pulse produced by conventional magnetrons will have side bands extending beyond the 20 megahertz bandwidth or greater than ± 10 megahertz from the center frequency with power levels which are higher than acceptable levels of radiation. To attenuate such side bands, delay 24 is introduced in channel 20 such that delay 24 in channel 20 produces an effective electrical wavelength at 3,000 megahertz which is an odd number of half wavelengths longer than the electrical wavelength of channel 18, and at a frequency of 3,010 megahertz channel 20 is an even number of half wavelengths longer than channel 18 so that all of the energy at a frequency of 3,010 or 2,900 megahertz is coupled through hybrid coupler 22 to the resistive load $Z_0$. While at a frequency 20 megahertz different from the center frequency the energy will all be coupled into the main channel 18 and hence to antenna 26, these side bands of the magnetron oscillator 10 are, for moderate power on commercial radars, well below levels which would produce objectionable interference with other equipment.

To produce a shift of $\lambda/2$ in delay 24 with the frequency change from 3,000 megahertz to 3,019 megahertz or one part in 300, delay should be $150.5\lambda$ long at a frequency of 3,000 megahertz.

Figure 2:
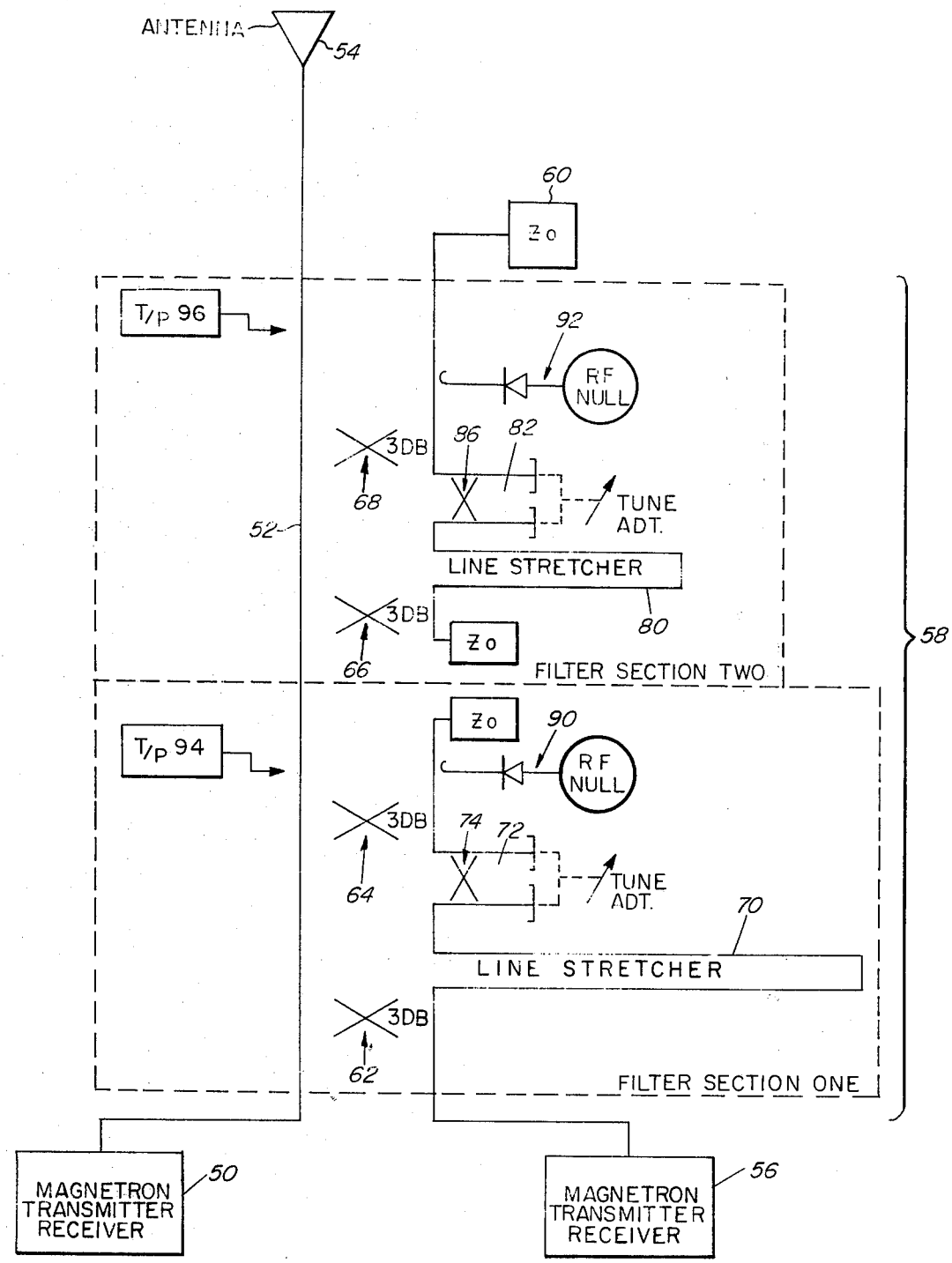
FIG. 2 illustrates a modification of the radar system in FIG. 1.

Referring now to FIG. 2, there is shown a system in which a cascaded filter system suitable for high power radars or radars in which two magnetrons having different frequencies can be transmitted either alternately or simultaneously to a single antenna. Such a system may be used, for example, in a dual frequency radar system with each magnetron transmitter having its own duplexer and separate receiver and display of a type shown in FIG. 1.

More specifically, magnetron transmitter receiver 50 is connected directly through channel 52 to an antenna 54 which is preferably of the directional type illustrated in FIG. 1. Magnetron transmitter receiver 56 is connected through a transmission channel 58 to an energy absorbing termination 60 having an impedance equal to the characteristic impedance of the channel 58. Channels 52 and 58 are coupled together at spaced points by directional couplers illustrated diagrammatically at 62, 64, 66 and 68. Couplers 62, 64, 66 and 68 are preferably three decibel or hybrid couplers similar to couplers 16 and 22 of FIG. 1 and which couple one-half of the energy in either channel into the other channel and introduce a $\lambda/4$ radian phase advance into the energy coupled through the coupler from one channel to the other. Thus, as described in connection with FIG. 1, if the energy in each channel is of the same phase and amplitude at the coupling points, no net transfer of energy between channels occurs. However, if the phase of the energy already flowing in the transferred channel leads the energy in the original channel by $\lambda/4$ radians, it will add in phase with energy being transferred from the original channel whereas energy in the transferred channel will advance $\lambda/4$ radians on transferral to the original channel and will be $\lambda/2$ radians different from, or out of phase with, the energy in the original channel and, hence, will cancel the energy therein so that all the energy will be propagated in the transferred channel.

In FIG. 2, two sections of filter are provided having different delay times. The first filter section comprising directional couplers 62 and 64 has a delay structure in channel 58 between couplers 62 and 64 to filter the side bands of the pulse oscillation from the individual magnetrons which are closest to the center frequencies of the magnetron. Filter section two is fed by filter section one and has a delay line shorter than that of filter section one to filter frequencies which pass filter section one.

Filter section one has, in channel 58, a fixed delay structure 70 and a variable delay structure 72 such as a movable shorting member for two line sections coupled equally by a directional coupler 74. Such a mechanically movable line adjuster is conventional and any desired version may be used. The delay between couplers 66 and 68 of filter section two comprises a fixed line stretcher 80 and an adjustable delay section 82 having a shorting plunger and a directive coupler 86 similar to adjustable structure 72.

Figure 3:
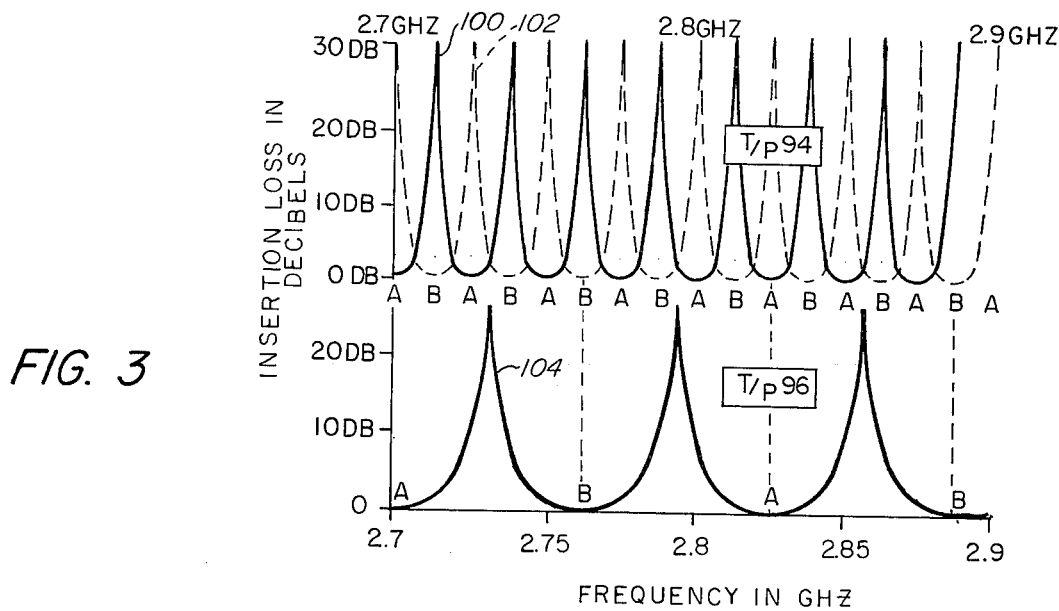
FIG. 3 illustrates a graph of filter characteristics of the system of FIGS. 1 and 2.

FIG. 3 shows the insertion loss at test points beyond couplers 64 and 68, respectively. The solid curve 100 shows the filter insertion loss of filter section one to a signal from transmitter 50 while dotted curve 102 shows the filter section one insertion loss to signals from transmitter 56, with losses being measured at test point 94.

Curve 104 shows the insertion loss of filter section two measured at test point 96 to a signal inserted at test point 94 or at transmitter 50 with filter section one replaced by equal length transmission lines. With both filter sections in place as in FIG. 2, the insertion loss at test point 94 to signals from transmitter 50 is the sum of curves 100 and 104.

Figure 4:
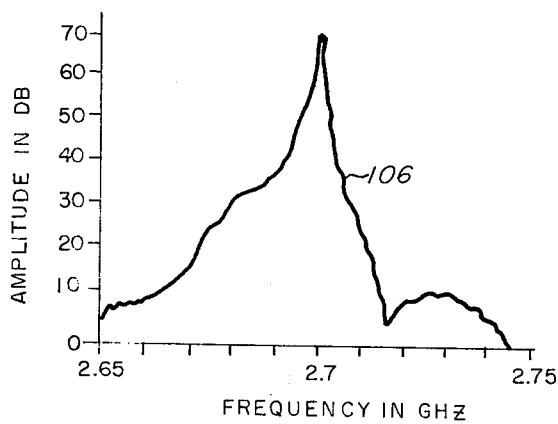
FIG. 4 illustrates a graph of the frequency spectrum of a pulsed magnetron.
Figure 5:
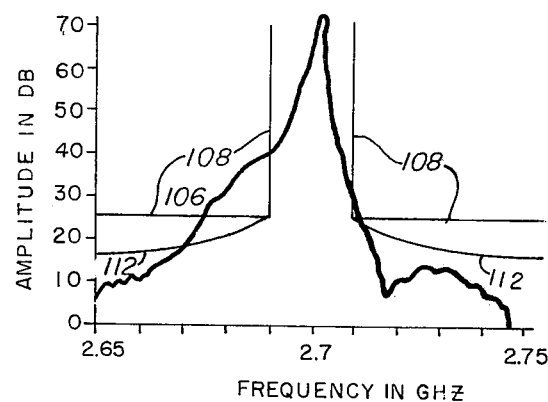
FIG. 5 illustrates certain radiation intensity limits for the frequency spectrum of FIG. 4.
Figure 6:
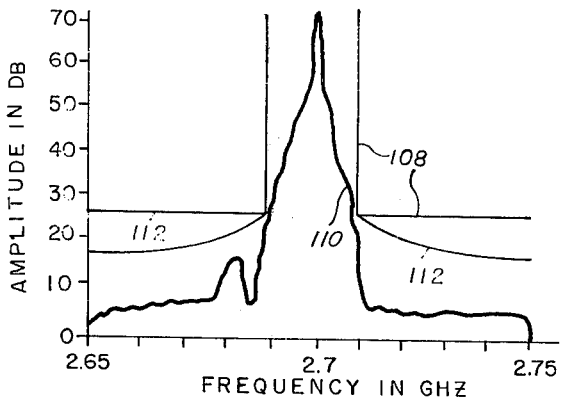
FIG. 6 illustrates the spectrum of FIG. 4 after filtering in a radar system in accordance with this invention to fall within the limits of FIG. 5.

FIG. 4 shows a typical spectrum 106 of frequencies of a magnetron pulse of oscillations having a center frequency of 2.7 gigahertz, while FIG. 5 shows in curve 108 the allowable limits of power frequency for a particular radar system with a portion of magnetron spectrum 106 beyond such limits. FIG. 6 shows the output of transmitter 50 to the antenna after passing through the two-section filter of FIG. 2, indicated as radiated spectrum 110 well within the limits of curve 108 and also within the limits of curve 112, generally desirable to avoid radiation interference with other radars or communication equipment.

The transmitter receiver 56 of FIG. 2 may be coupled to the antenna without interference with the transmitter receiver 50 by placing the center frequency of transmitter receiver 50, for example, at 2.7000 gigahertz on any point A in FIG. 3 curve 104 and the center frequency of transmitter receiver 56 at 2.7625 gigahertz on point B on curve 104 whose minimum insertion loss corresponds to a minimum insertion loss point of curve 102. Signals from source 56 will then pass to and from the antenna at frequency B and to and from source 50 and the antenna at frequency A. Adjustment of the delay sections is used to cause the desired frequency A of curve 104 to be the same as any of the frequency A points of curve 100 and the selected frequency B point of curve 104 to be aligned with any of the frequency B points of curve 102.

DESCRIPTION OF THE PREFERRED METHOD OF OPERATION

A pulse echo radar, as shown in FIG. 2, has pulses of energy at different frequencies. The first section of the filter 14 is connected to the magnetron transmitter microwave power sources 50 and 56 and functions as a very narrow band "comb filter" having a rejection characteristic at its output, as diagrammed at "T/P-54" in FIG. 3. This first section also diplexes for two transmitters and receivers tuned for simultaneous operation at different frequencies. The frequency differences between transmitters is any combination of low insertion-loss notches in the periodic filter characteristic, such that one transmitter is tuned to a frequency A notch and the other is tuned to a frequency B notch. The minimum allowable separation ($\Delta f$) measured in this first section filter setup is approximately 12.5 megahertz, but separations of 37.5 megahertz, 62.5 megahertz, 87.5 megahertz, 112.5 megahertz are all simultaneously available.

The significant periodicity and narrow bandwidth of the first section filter notches were established by the first filter section delay. The notch characteristic serves to filter both signal frequencies simultaneously. This overall periodic characteristic is adjusted upward and downward in frequency by the line-length-changer consisting of a hybrid coupler and the pair of mechanically adjustable balanced short circuit (reflection) terminations.

The second filter section is substantially identical to the first section except that the dual frequency input to the second section is through a single input port and, hence, the companion input arm of the second section is resistively terminated by a matched load $Z_0$ and the transmission delay is shorter than in the first filter section. As a consequence, a wider notch bandwidth and more widely spaced periodicity results. This second section filter characteristic is selected so that when aligned with the first section as depicted by "T/P-56" of FIG. 3, the maximum rejection frequency of the second section occurs approximately at the second low-insertion loss notch of the first section on either side of the frequency.

This completes the description of the embodiments of the invention disclosed herein. However, many modifications of the invention will be apparent to persons of ordinary skill in the art without departing from the spirit and scope of this invention. For example, the filter structure could be used in microwave communications links, and the details of the couplers could be altered dependent on the filter application. Accordingly, it is intended that the invention be not limited to the particular details of the embodiments disclosed herein except as defined by the appended claims.

What is claimed is:

1. In combination:
a source of oscillations having a predetermined frequency spectrum with a major portion of the energy of said oscillations being within a predetermined region of said spectrum;
frequency responsive filter means fed by said source and comprising a plurality of channels coupled together through a plurality of hybrid couplers at spaced locations along said channels, with a first of said channels having a transit time which is substantially different from a second of said channels; and
said filter means coupling said major energy portion of said oscillations to a load through the output of said first of said channels and coupling the portions of said oscillations outside said region of said spectrum to an output of said second of said channels.

2. The combination in accordance with claim 1 wherein said source of oscillations is a magnetron.

3. The combination in accordance with claim 2 wherein said magnetron generates pulses of oscillations.

4. The combination in accordance with claim 1 wherein said oscillations are pulses whose frequency spectrum exceeds the passband of said filter means from said source to said first output.

5. The combination in accordance with claim 1 wherein said filter couples energy outside the passband of said filter through said second output to a separate load.

6. A radar system comprising:
a source of pulses of oscillations having a predetermined frequency spectrum;
means for coupling the major portion of oscillations from said source to a load;
said coupling means comprising a filter having a plurality of channels connected at a plurality of points by directional couplers, with the delay time of said channels between said points of connection being different by a predetermined amount; and
the passband characteristics of said filter being selected by said delay time to restrict oscillations passing to said antenna through said filter to a predetermined region of said frequency spectrum, with portions of said oscillations lying outside said predetermined region of said spectrum being coupled to a separate output of said filter.

7. The radar system in accordance with Claim 6 wherein said source of oscillations comprises a magnetron.

8. The radar system in accordance with Claim 6 wherein said directional couplers have predetermined phase shifts.

9. The radar system in accordance with claim 6 wherein said load fed by said major portion of said oscillations passing through said filter comprises a directional antenna which provides said load.

10. The radar system in accordance with Claim 9 wherein the direction of radiation of said antenna is moved in synchronism with a characteristic of a display fed by signals received by said antenna and passing through said filter.

11. The method of filtering oscillations from a source within a predetermined frequency spectrum comprising the steps of:
coupling said oscillations from said source to a plurality of channels with a first hybrid coupler; and
coupling said channels to a load with a second hybrid coupler, with the transit times of said channels betweed said hybrid couplers being different from each other, thereby directing the portion of said oscillations within a predetermined region of said spectrum to said load and absorbing the portion of said oscillations outside of said region of said spectrum.

12. The method in accordance with claim 11 wherein said source of oscillations is a magnetron.

13. The method in accordance with claim 12 wherein said magnetron generates pulsed oscillations.

14. The method in accordance with claim 11 wherein the frequency spectrum of said oscillations exceeds the passband of said filter.

15. The method in accordance with claim 11 wherein said filter couples energy outside the passband of said filter to a separate load.

16. The method of echo ranging comprising the steps of:
generating pulses of oscillations having predetermined frequency spectrums:
directing oscillations from said source to an antenna through a filter having a plurality of channels coupled together at a plurality of spaced points by directional couplers, with the delay time of said channels between said couplers differing by a predetermined amount and having passband characterics which couple a predetermined region of the frequency spectrum of a pulse of said oscillations to said antenna through a first output of said filter and couple the region of said frequency spectrum outside said predetermined region of said frequency spectrum through a second output of said filter to an absorbing load; and
deriving echo signals from a receiver coupled to said antenna through said filter.

17. The method in accordance with claim 16 wherein said step of generating said oscillations comprises supplying a pulse of energy to a magnetron.

18. The method in accordance with claim 16 wherein said directional couplers comprise hybrid couplers.

19. The method in accordance with claim 16 wherein said antenna is a directional antenna.

20. The method in accordance with claim 19 wherein the direction of radiation of said antenna is moved in synchronism with a characteristic of said display fed by a signal derived from said receiver.

* * * * *